US009760008B2

(12) United States Patent
deVilliers

(10) Patent No.: US 9,760,008 B2
(45) Date of Patent: Sep. 12, 2017

(54) DIRECT CURRENT SUPERPOSITION FREEZE

(71) Applicant: Tokyo Electron Limited, Minato-ku, Tokyo (JP)

(72) Inventor: Anton J. deVilliers, Clifton Park, NY (US)

(73) Assignee: TOKYO ELECTRON LIMITED, Tokyo (JP)

(*) Notice: Subject to any disclaimer, the term of this patent is extended or adjusted under 35 U.S.C. 154(b) by 235 days.

(21) Appl. No.: 14/532,672

(22) Filed: Nov. 4, 2014

(65) Prior Publication Data
US 2015/0160557 A1 Jun. 11, 2015

Related U.S. Application Data

(60) Provisional application No. 61/912,015, filed on Dec. 5, 2013.

(51) Int. Cl.
| | |
|---|---|
| *H01L 21/3105* | (2006.01) |
| *G03F 7/20* | (2006.01) |
| *G03F 7/00* | (2006.01) |
| *G03F 7/40* | (2006.01) |

(52) U.S. Cl.
CPC .......... *G03F 7/2024* (2013.01); *G03F 7/0035* (2013.01); *G03F 7/40* (2013.01)

(58) Field of Classification Search
CPC ... G03F 7/405; G03F 7/0035; H01L 21/02351
USPC ................................................. 430/324, 394
See application file for complete search history.

(56) References Cited

U.S. PATENT DOCUMENTS

| | | | |
|---|---|---|---|
| 6,414,438 B1 | 7/2002 | Borisov et al. | |
| 2009/0275207 A1* | 11/2009 | Honda | H01J 37/32027 438/729 |
| 2010/0036518 A1 | 2/2010 | Funk et al. | |
| 2010/0310995 A1 | 12/2010 | Chen et al. | |
| 2011/0256726 A1 | 10/2011 | LaVoie et al. | |
| 2012/0082942 A1 | 4/2012 | Godet et al. | |
| 2012/0253497 A1 | 10/2012 | Prager et al. | |
| 2013/0048605 A1 | 2/2013 | Sapre et al. | |

OTHER PUBLICATIONS

International Patent Application No. PCT/US2014/063883, "International Search Report and Written Opinion," mailed Jan. 21, 2015, International Filing Date Nov. 4, 2014.

* cited by examiner

*Primary Examiner* — Daborah Chacko Davis
(74) *Attorney, Agent, or Firm* — DLA Piper LLP US

(57) ABSTRACT

Systems and methods include improved techniques for patterning substrates, including improvements to double patterning techniques. Direct current superposition plasma processing is combined with photolithographic patterning techniques. An electron flux or ballistic electron beam from a plasma processing system can induce cross linking in a given photoresist, which alters the photoresist to be resistant to subsequent light exposure and/or developer treatments. Plasma processing is also used to add a protective layer of oxide on exposed surfaces of a first relief pattern, thereby protecting the photoresist from a developing acid. By protecting an initial photoresist relief pattern from developing acid, a second pattern can be applied on and/or between the first photoresist relief pattern thereby doubling an initial pattern or otherwise increasing pattern density. This combined pattern can then be used for subsequent microfabrication such as transferring the combined pattern into one or more underlying layers.

21 Claims, 5 Drawing Sheets

DIRECT CURRENT SUPERPOSITION FREEZE

CROSS REFERENCE TO RELATED APPLICATIONS

The present application claims the benefit of U.S. Provisional Patent Application No. 61/912,015, filed on Dec. 5, 2013, entitled "Direct Current Superposition Freeze," which is incorporated herein by reference in its entirety.

BACKGROUND OF THE INVENTION

This invention relates to patterning thin films and various layers on a substrate. Such patterning includes patterning for fabricating semiconductor devices within a photolithographic patterning scheme.

In material processing methodologies (such as photolithography), creating patterned layers comprises the application of a thin layer of radiation-sensitive material, such as photoresist, to an upper surface of a substrate. This radiation-sensitive material is transformed into a patterned mask that can be used to etch or transfer a pattern into an underlying layer on a substrate. Patterning of the radiation-sensitive material generally involves exposure by a radiation source through a reticle (and associated optics) onto the radiation-sensitive material using, for example, a photolithography system such as a scanner or stepper tool. This exposure can then be followed by the removal of irradiated regions of the radiation-sensitive material (as in the case of positive photoresist), or non-irradiated regions (as in the case of negative resist) using a developing solvent. This mask layer may comprise multiple sub-layers.

SUMMARY

Conventional lithographic techniques for exposing a pattern of radiation or light onto a substrate have various challenges that limit a size of features exposed, and limit pitch or spacing between exposed features. One conventional technique to mitigate exposure limitations is that of using a double patterning approach to allow the patterning of smaller features at a smaller pitch than what is currently possible with conventional lithographic resolution. One approach to reduce the feature size is to use a conventional lithographic pattern and etch techniques on a same substrate twice (known as LELE—Litho/Etch/Litho/Etch) with one pattern offset from another, thereby forming more features spaced closely together to achieve a smaller feature size than would be possible by a single-exposure lithographic step. During LELE double patterning, the substrate is exposed to a first pattern and the first pattern is developed in the radiation-sensitive material. This first pattern is formed in the radiation-sensitive material and is transferred to an underlying layer using an etching process. This series of steps is repeated to create a second pattern, which is usually offset from the first pattern.

Another approach to reduce feature size is to use a conventional lithographic pattern on the same substrate twice followed by etch techniques (known as LLE—Litho/Litho/Etch), thereby using relatively larger scale patterns spaced closely together to achieve a smaller feature size than would be possible by a single exposure. During LLE double patterning, the substrate is exposed to a first light pattern and then the substrate is exposed to a second light pattern. A first latent pattern and a second latent pattern are developed in the radiation-sensitive material. A resulting topographic or relief pattern formed in the radiation-sensitive material can then be transferred to an underlying layer using an etching process, such as a plasma-based dry etching process.

Another approach to LLE double patterning includes a Litho/Freeze/Litho/Etch (LFLE) technique that uses an application of a freeze material on a first patterned layer to cause cross-linking therein, thus allowing the first patterned layer to withstand subsequent processing of patterning a second layer with a second pattern. A second LFLE freeze technique involves including a cross-linker additive material within the first layer (prior to exposure) instead of depositing a freeze material after development. This cross-linker is then thermally activated to increase resistivity to solvents. Thus this "freeze" refers to changing material properties of a patterned layer to be able to withstand other solvents or resists coated on top. Conventional LFLE techniques, however, suffer from poor throughput and unacceptable defectivity, among other things.

Systems and methods disclosed herein include improved patterning processes including improvements to Litho/Freeze/Litho/Etch (LFLE) patterning techniques. In one conventional LFLE process, a "freeze" process step is executed using a liquid chemical that is spun onto a substrate or wafer. This chemical freeze layer reacts with exposed surfaces to form a protective layer. Such a technique can be functional, but removing the chemical freeze layer can involve using a developing solution followed by wet cleaning. In another conventional LFLE process, a thermal freeze approach, a cross-linking agent is added to the resist during initial application of a film. By thermally treating this film, the cross-linking agent changes the solubility to tetramethylammonium hydroxide (TMAH), which prevents the second pattern from washing away the first pattern. Such a thermal freeze, however has drawbacks. For example, the cross-linking agent displaces other elements in the photoresist, which results in poor line width roughness (LWR) on the first layer. Also, some surface areas are not fully cross-linked and thus still soluble, which results in even poorer line edge roughness (LER). Thus, both the chemical freeze approach and the thermal freeze approach have disadvantages.

Techniques herein can eliminate these additional developing and cleanings steps. Techniques herein include using etch tools or systems to "freeze" a first patterned resist layer (relief pattern) to alter properties of corresponding material so that subsequent lithographic exposure and developing does not removed the first patterned layer. Etching tools can use plasma to change the surface of a wafer with many different techniques. Etching tools can also be used to deposit a film evenly or unevenly across the top of the wafer. Etching tools can also burn all organic material off the top of the wafer or remove all inorganic material from the top of the wafer. An etching tool having Direct Current Superposition (DCS) functionality can be used to combat ion shadowing within high-aspect ratio trenches. DCS functionality can also be used to shrink sides and smooth rough edges of features on the wafer. DCS involves applying or superimposing a negative direct current voltage on an upper electrode in a plasma chamber, which causes plasma particles to bombard the upper electrode or upper chamber surface. This bombardment releases electrons which, because of the superimposed direct current, are accelerated through the plasma towards the substrate. Thus an electron flux or ballistic electron beam is generated originating from the upper electrode, passing through the plasma, and striking the substrate opposite the upper electrode with a beam of electrons approximately as large as the upper electrode and/or plasma. Thus an entire wafer surface can be treated with a flow of electrons as compared to relatively narrow exposure of e-beam technology.

Techniques herein combine direct current superposition etching processes with photolithographic patterning techniques. The electron flux or ballistic electron beam herein can induce cross linking in a given photoresist, which alters the photoresist to be resistant to subsequent light exposure and developer exposure. A DCS etching system can also be used to add a protective layer of oxide on the outside of all features, thereby further protecting the photoresist from a developing acid. By protecting the resist from developing acid the DCS Freeze (DCSF) herein enables an improved LFLE process. This is beneficial because LFLE is already a process generally preferred over LELE. In addition to other benefits from DCS, DCS is a Freeze for the LFLE process. Techniques herein improve line edge roughness (LER) as compared to chemical and thermal freeze techniques. Moreover, thermal and chemical freezes are incapable of withstanding negative tone develop processing. Photoresist resists processed with techniques herein, however, are capable of withstanding negative tone developer processing.

One example embodiment includes a method for double patterning a substrate. A first layer of radiation-sensitive material is formed on a substrate. A first exposure pattern in the first layer of radiation-sensitive material is developed. The first exposure pattern having been exposed via photolithography. Developing the first exposure pattern results in a first patterned layer. The substrate is positioned in a processing chamber of a capacitively coupled plasma system. The first patterned layer is treated with a flux of electrons by coupling negative polarity direct current power to an upper electrode of the plasma processing system. The flux of electrons is accelerated from the upper electrode with sufficient energy to pass through a plasma and strike the substrate such that an exposed surface of the first patterned layer changes in physical properties. A second layer of radiation-sensitive material is formed on the substrate. A second exposure pattern is developed in the second layer of radiation-sensitive material. The second exposure pattern having been exposed via photolithography. Developing the second exposure pattern results in a second patterned layer such that the second patterned layer and the first patterned layer form a combined pattern. The combined pattern can then be used for subsequent processing such as transferring the combined pattern into one or more underlying layers.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

DETAILED DESCRIPTION

Figure 1:
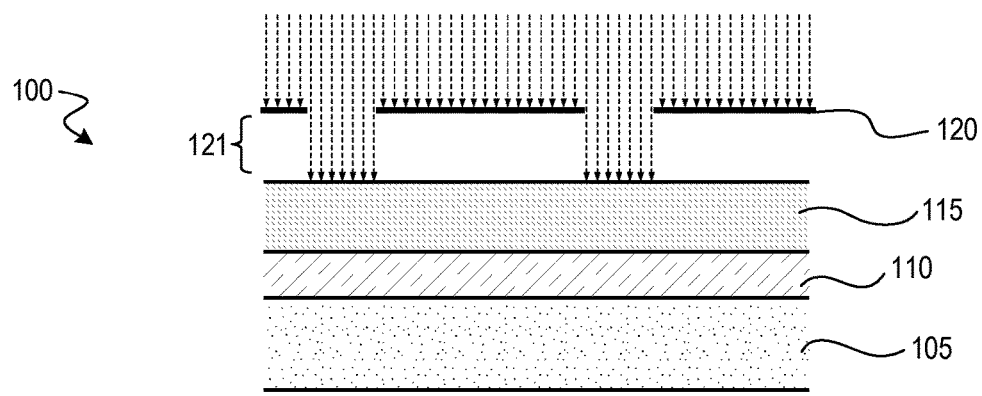
FIGS. 1-9 are schematic, cross-sectional views of a substrate segment showing a process sequence for patterning a substrate.

Systems and methods disclosed herein include improved techniques for patterning substrates, including improvements to double patterning techniques. Techniques herein combine direct current superposition plasma processing with photolithographic patterning techniques. An electron flux or ballistic electron beam herein from plasma processing can induce cross linking in a given photoresist, which alters the photoresist to be resistant to subsequent light exposure and/or developer treatments. Plasma processing can also be used to add a protective layer of oxide on exposed surfaces of a first relief pattern, thereby further protecting the photoresist from a developing acid. By protecting an initial photoresist relief pattern from developing acid, a second pattern can be applied on and/or between the first photoresist relief pattern thereby doubling an initial pattern or otherwise increasing pattern density. This combined pattern can then be used for subsequent processing such as transferring the combined pattern into one or more underlying layers.

Embodiments herein can use an electron beam treatment and sputter deposition to protect an initial relief pattern for subsequent processing. This direct current superposition freeze (DCSF) herein enables an improved LFLE (Litho/Freeze/Litho/Etch) process. This improvement is beneficial in part because LFLE is already a process generally preferred over LELE (Litho/Etch/Litho/Etch). In addition to other benefits from DCS, DCS can be used herein as a freeze for the LFLE process. Techniques herein improve line edge roughness (LER) as compared to chemical and thermal freeze techniques. Moreover, thermal and chemical freezes are incapable of withstanding negative tone develop processing. Photoresist resists processed with techniques herein, however, are capable of withstanding negative tone developer processing.

In a conventional patterning process in the semiconductor industry, two sets of patterns are added onto one layer of a wafer according to the LFLE process. Essentially, two different patterns are placed on the wafer one at a time with the second pattern shifted relative to a first pattern. LFLE includes "freezing" the first pattern with heat or with a chemical deposition before etching into a hardmask or other underlying layer. This freeze, or material property modification technique, is intended to prevent a second deposited resist from removing the first patterned resist, which has already been patterned and developed. In contrast to using a chemical, spun-on freeze material, techniques herein expose a first patterned resist to plasma having an accompanying flux of ballistic electrons, such as by applying negative direct current to an upper electrode of particular plasma processing system. This substrate treatment materially modifies or freezes the first patterned resist layer prior to applying and exposing a second photoresist layer in a LFLE patterning process.

The DCS Freeze can harden the photoresist via crosslinking from ballistic electrons. The DCS Freeze herein can also create a layer of SiO2 film around the outside (exposed surfaces) of the photoresist. This SiO2 skin, which is a conformal or semi-conformal film, as well as increased cross-linking, prevents a second layer of photoresist and a second developer from removing the first layer of patterned photoresist.

Such a DCS Freeze is beneficial over conventional freeze techniques because it enables all types of resist material selection. For example, techniques herein can be used with a conventional photoresist first layer and a conventional photoresist second layer that are both selected from a positive tone developer (PTD) compatible composition. Techniques herein can also be used with a negative tone developer (NTD) compatible composition used for the first layer and second layer. In one example scheme, a conventional resist first layer and conventional resist second layer—with one composition being negative tone developer compatible and the other being positive tone developer compatible—is also possible with techniques herein. Techniques herein also enable use of an unconventional resist such as an alcohol-based resist as the first layer and/or second layer in combination with a conventional resist (positive or negative tone developer compatible). An advantage of processes disclosed herein is an ability to execute a LFLE process in which both photoresist layers are negative tone developer compatible. This advantage is significant because conventionally is not possible to use negative tone developer compatible resists for both processes or both layer/patterning applications of resist. Moreover, the DCS Freeze disclosed herein can be used to create any kind of features, for example, a line in line pattern for pitch splitting, or crisscross patterning for defining contact holes, etc.

Referring now to FIGS. 1-9, an example patterning process is described that includes an example DCS freeze process for a LFLE (litho/freeze/litho/etch) application. In one embodiment, as shown in FIG. 1, a substrate 100 includes an underlying layer 110 (which can be considered as a target layer) positioned on a base layer 105. The base layer 105 and underlying layer 110 can both include multiple layers, but for convenience is illustrated as having a single material. Various materials can be selected for these layers including silicon-containing materials, organic materials, or other materials such as those commonly used in the fabrication of integrated circuits. A first layer of radiation-sensitive material 115 is formed on substrate 100 and positioned on underlying layer 110. This layer can be formed via spin coating using a coater/developer tool, such as a track tool. Note that additional intermediate layers or films can be used as need to enable photolithographic processing. For example, a layer of anti-reflective material can be positioned between the first layer of radiation-sensitive material 115 and the underlying layer 110. The first layer of radiation-sensitive material 115 is then exposed to a pattern of light to create a first exposure pattern in the first layer of radiation-sensitive material 115. This first exposure pattern is essentially a latent pattern having been exposed via photolithography. For example, a photolithographic exposure process can be executed that exposes the first layer of radiation-sensitive material 115 to radiation 121 of one or more light wavelengths through a patterned mask 120 such that a solubility of portions of the first layer of radiation-sensitive material 115 is changed. The change can be either to make material exposed to light soluble or make material exposed to light insoluble to a particular type of developing solvent.

Figure 2:
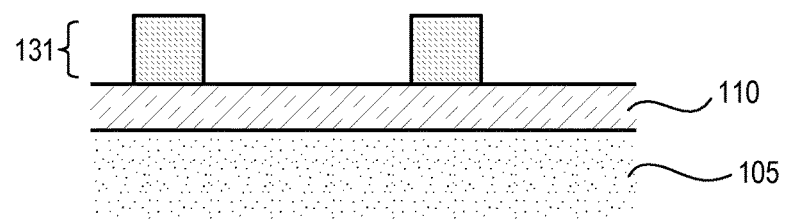

The first exposure pattern created in the first layer of radiation-sensitive material 115 is then developed. Developing the first exposure pattern results in a first patterned layer 131, as shown in FIG. 2. Developing the first exposure pattern can include using developing chemicals to dissolve and remove the first exposure pattern from the first layer of radiation-sensitive material 115. The first patterned layer can include lines, trenches, holes, or structures of any shape. Structures created can include structures created at a first spacing. This first spacing can be designed to accommodate a second patterning layer as will be described below. The composition of the first patterned layer 131 (and the first layer of radiation-sensitive material 115) can be selected from any of negative photoresist, negative tone developer compatible photoresist, positive tone photoresist, positive tone developer compatible photoresist, and alcohol-based photoresist.

After creation of first patterned layer 131, the substrate 100 is treated with a plasma processing step. The substrate 100 is positioned in a processing chamber of a capacitively coupled plasma system. Plasma processing systems in general are known to those skilled in the art. Such systems typically include a vacuum chamber, gas conduits for feeding a source gas to the chamber, and one or more power sources configured to ignite and maintain plasma within the chamber. In a capacitively-coupled electrode, there is typically a pair of electrodes facing each other, with a substrate mountable on one of the electrodes, and space between the two electrodes to create and maintain plasma.

Figure 3:
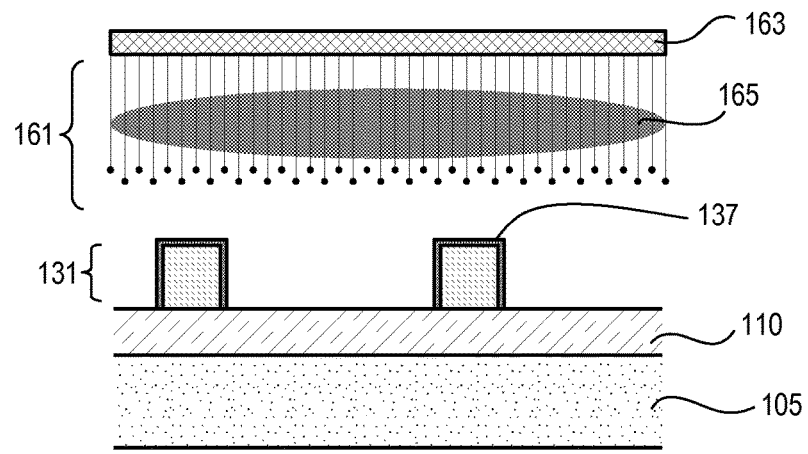

In the plasma processing chamber, the first patterned layer 131 is treated with a flux of electrons 161, as shown in FIG. 3, by coupling negative polarity direct current power to an upper electrode 163 of the plasma processing system. The flux of electrons 161 is accelerated from the upper electrode 163 with sufficient energy to pass through plasma 165 and strike the substrate 100 such that an exposed surface of the first patterned layer 131 changes in physical properties. The plasma 165 can be created in the processing chamber from a process gas flowed into the processing chamber. The process gas can include an inert gas and hydrogen, a noble gas and nitrogen, and other gas combinations. The process gas or gases used preferably is not selected as etchant gases that might create products that chemically react with materials in the substrate to remove substantial portions of substrate material.

The change in physical properties can include increased cross-linking of the exposed surface 137 such that the exposed surface 137 of the first patterned layer 131 increases in resistance to particular developing chemicals. For example, such cross-linking can cause the first patterned layer 131 to become insoluble to given chemical solvents. In The application of negative polarity direct current power to the upper electrode 163 can cause sputtering. In some embodiments, the upper electrode 163 is comprised of silicon or has a silicon-containing surface facing plasma 165. DC superposition can cause sputtering of silicon from the upper electrode 163, when then becomes deposited on the first patterned layer creating a semi-conformal layer of silicon on the first patterned layer. The sputtering can be considered semi-conformal because certain surface of the first patterned layer 131 may have a greater collection angle as compared to other surfaces. The sputtering and subsequent path of silicon from the upper electrode 163 is largely an isotropic flow, but factors such as collection angle and mass transport can result is a deposition of silicon that is not fully conformal.

Figure 10:
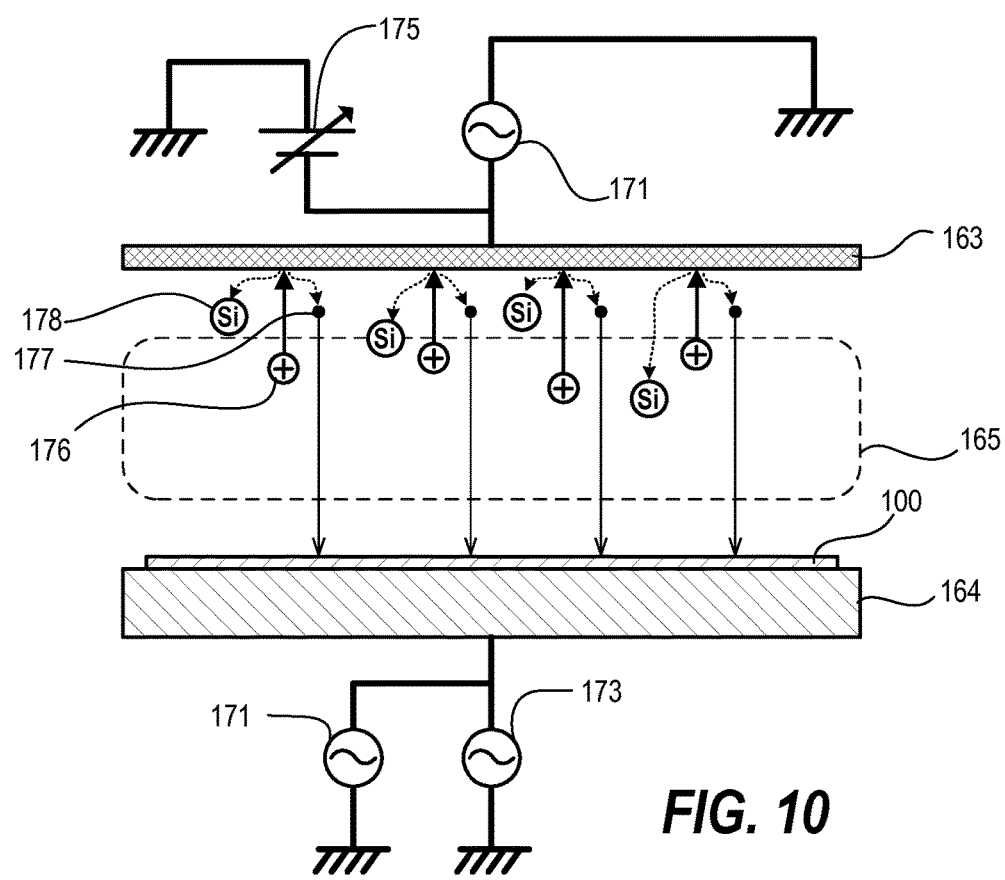
FIG. 10 is a schematic, cross-sectional view of a plasma processing system which also illustrates plasma activity.

FIG. 10 is a simplified schematic diagram of the result of superimposing negative polarity direct current on upper electrode 163. FIG. 10 includes a cross-sectional schematic of an example plasma processing system. There are several different types of plasma processing systems that are conventionally used, and those skilled in the art are familiar with general operation, and thus this disclosure will not described details of operation of a conventional plasma processing system. Substrate 100 is positioned on lower electrode 164. Source radio frequency power 171 can be applied to either the upper electrode 163, or to the lower electrode 164. A bias radio frequency power 173 can be applied to the lower electrode to enable anisotropic etching when desired. DC power source 175 is configured to apply negative direct current power to the upper electrode 163.

The DCS treatment step can be executed within a capacitively coupled plasma (CCP) processing system, which typically forms plasma between two opposing, parallel plates (an upper electrode and a lower electrode). Typically a substrate rests on the lower electrode or a substrate holder positioned just above the lower electrode. Applying negative DC to an upper electrode then draws positively charges ions 176 (positively charged species) toward the upper electrode 163. This upper electrode 163 is made of, or coated with, a desired conductive material. Typically this conductive material is silicon, but other materials can be used (such as germanium) for specific applications.

Direct Current Superposition includes the application of a negative DC voltage on an upper electrode in a capacitively coupled plasma (CCP) processing chamber. The upper electrode (top electrode) refers to an electrode opposite of where a substrate is positioned. There are two common electrical configurations of a CCP processing chamber. In each configuration there is a source radio frequency (RF) power 171 that creates and maintains plasma from process gasses, and there is also a bias RF power 173 that can be optionally applied to anisotropically draw plasma species towards a substrate 100 being processed. A common source RF power can be applied at 60 MHz or higher, while a common bias frequency is 13 MHz or 2 Mhz, though other frequencies can be used for particular applications. In one configuration, a source power and bias power are decoupled in that source RF power is applied to an upper electrode, while bias power is applied to a lower electrode (substrate containing electrode). In another configuration, both source (high frequency) and bias (low frequency) powers are applied to the lower electrode. In either configuration a negative direct current voltage can be applied to the upper electrode and can be considered as superimposed DC voltage to a CCP system in that the CCP system already has a source power and possibly a bias power. Thus, this technique can be labeled as direct current superposition (DCS).

In one example embodiment, DC voltage that is applied can be around 1 kilovolt (kV), with current around 2.5 milliamps per centimeter squared. When negative DC voltage is applied to the upper electrode, the upper electrode attracts positive ions 176 within plasma 165 that exists between the parallel plate electrodes. The positive ions 176 that are accelerated toward the upper electrode 163 have sufficient energy that upon striking the upper electrode the positive ions 176 produce secondary electrons 177 as well as sputtering some of silicon atoms 178. The secondary electrons produced then get accelerated by the negative DC voltage (accelerated away from the upper electrode 163) and have sufficient energy to travel entirely through the plasma 165 and strike the substrate below. With these electrons having around 1 keV of energy (or more), these electrons can easily pass through the plasma and wafer sheath. These electrons can be referred to as ballistic electrons. These electrons can strike the substrate with sufficient energy to pass through substrate layers that are several hundred nanometers thick.

The silicon atoms 178 that have been sputtered from the upper electrode 163 can be deposited on the substrate 100 below. The upper electrode should be selected from a conducting material to enable creating a beam of ballistic electrons. Any number of process gasses can be used for creating plasma for this DCS treatment of a substrate. For example, Nitrogen and Argon ions have sufficient energy to easily sputter a silicon electrode. In many applications, a noble gas can be used alone or in combination with other gasses. For example a mixture of Argon and hydrogen or nitrogen can be used. For curing applications, a mixture of argon and nitrogen can produce beneficial results.

Note that because this technique consumes an upper electrode, the upper electrode needs to be replaced after a specific amount of use or degree of depletion. Note that other conductive materials (typically metals) can be used as the upper electrode, but atoms from whichever conductive material is selected will sputter and be deposited on a substrate below. In the semiconductor industry, many metals deposited on a wafer can have a negative effect on device fabrication or become corroded, but silicon deposition is generally a non-harmful material in conventional processes. Germanium and other materials can also be used.

Figure 4:
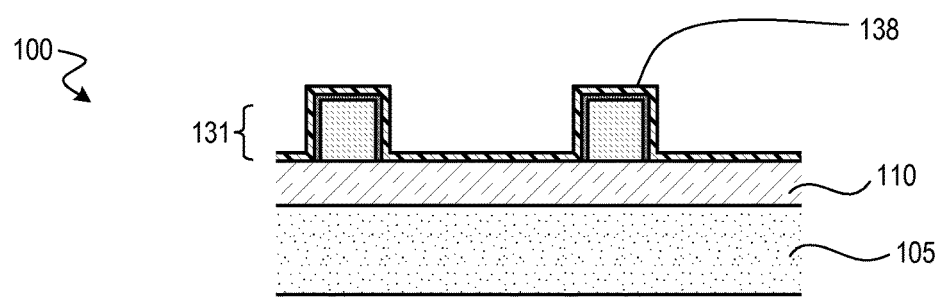

The electron flux (ballistic electrons or e-beam) can produce dangling bonds of various resist chemical groups, which can enable cross-linking of the resist, thereby changing the resist's physical properties. The electron flux can be sufficient to increase cross-linking in the first patterned layer 131. A semi-conformal layer 138, such as an oxide layer, can be formed from the DCS treatment as shown in FIG. 4. Initially, a layer of pure silicon develops on the substrate surface because of silicon sputtering, but as soon as the substrate leaves the etch processing chamber into an oxygen environment (out of the vacuum chamber), the pure silicon layer can immediately or quickly oxidize and form a silicon oxide layer. The, embodiments can include exposing the semi-conformal layer of silicon to an oxygen-containing environment such that the semi-conformal layer 138 of silicon becomes silicon oxide. The silicon oxide layer can then act as a protective layer. This negative polarity DC coupling results in sputtering of the upper electrode. The amount of sputtering can be controlled, however, to result in a specific thickness of silicon deposited on the substrate (12 nm, 6 nm, 2 nm, etc.), such as a thickness sufficient to protect an underlying resist layer. In some embodiments, the amount of sputtering is controlled to create a semi-conformal layer of silicon oxide sufficiently thick such that the first patterned layer is protected from subsequent developing chemicals.

Thus, the result of the DCS freeze is an increase of crosslinking of photoresist edges of photoresist material, as well as creating a protective film (such as silicon dioxide) around the patterned photo resist. The result is that the first patterned layer 131 is protected from developing chemicals used for dissolving and removing resists, and also from actinic radiation.

Figure 5:
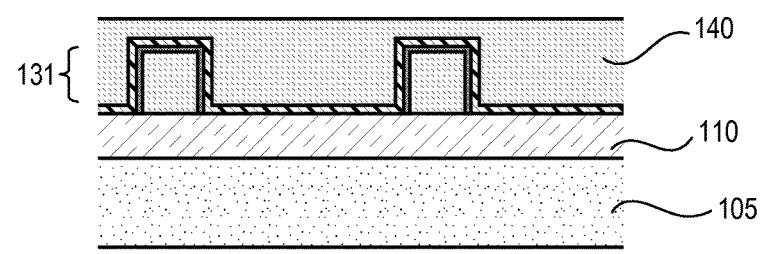

Referring now to FIG. 5, a second layer of radiation-sensitive material 140 is formed on the substrate 100. The second layer of radiation-sensitive material can be selected from any of various resist compositions such as negative tone photoresist, positive tone photoresist, negative tone developer compatible photoresist, positive tone developer compatible photoresist, alcohol-based resist, and so forth. For example, the first patterned layer 131 is coated with a second photoresist layer. Note that with the first patterned layer 131 protected as described above, the second layer of radiation-sensitive material can be selected as a same material as the first layer of radiation-sensitive material. In one example embodiment, both the first and second photoresist material can be positive tone developer (PTD) resist. Note that this technique can provide significant improvement in LWR (line width resolution). A given final critical dimension (CD) can be trimmed up or down during the DCS freeze process. Such fine tuning is beneficial for schemes or designs in which more space is desired for double patterning or less space is desired for line-on-line with negative tone developer (NTD) compatible resists to make isolated contact patterns and tune CDs.

Figure 6:
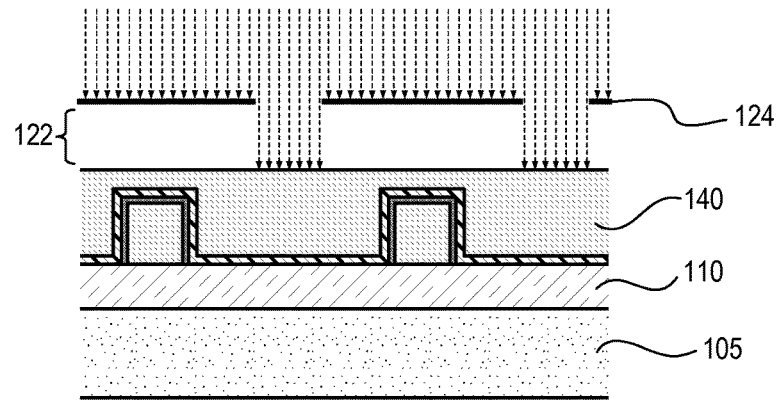
Figure 7:
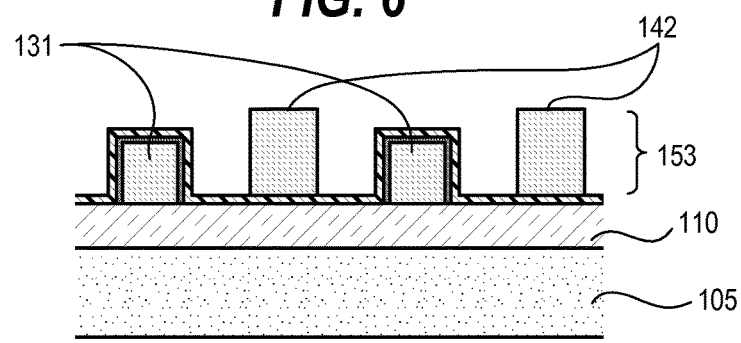

Referring not to FIG. 6, the second layer of radiation-sensitive material 140 can then be exposed to a pattern of light such as be using a photolithography exposure tool. For example, a photolithographic exposure process can be executed that exposes the second layer of radiation-sensitive material 140 to radiation 122 of one or more light wavelengths through a patterned mask 124 such that a solubility of portions of the second layer of radiation-sensitive material 140 is changed. This creates a second exposure pattern in the second layer of radiation-sensitive material 140. The second exposure pattern is developed and results in a second patterned layer 142, as shown in FIG. 7. This second patterned layer 142 can then be combined with the first patterned layer 131, which can double a density of lines or other features. The second patterned layer 142, combined with the first patterned layer 131, forms a combined pattern 153. The combined pattern 153 can include intersecting features such as trenches. The combined pattern 153 can include trenches defined by the second patterned layer 142 that intersect with trenches defined by the first patterned layer 131. In some embodiments, trench intersections can define contact holes.

Figure 8:
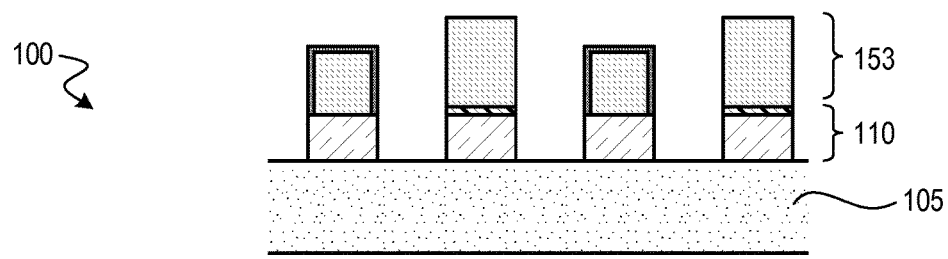
Figure 9:
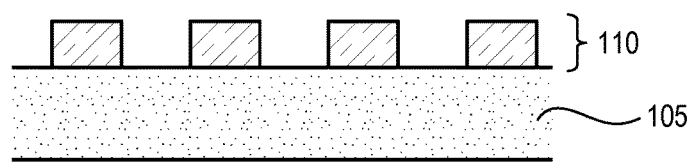

The combined pattern 153 can then be etched into underlying layer 110, and then any remaining photoresist or patterning material can be removed (if not removed during plasma etching). A result of this step is shown in FIG. 8 in which a line-in-line pattern is illustrated. The combined pattern 153 can then be removed, resulting in an underlying layer 110 that is patterned, which could be functional structures, a hardmask, etc. There are several different resist or pattering schemes available using DCS Freeze techniques as disclosed herein. In on scheme, a Positive Tone Developer (PTD) is used. A first set of lines with PTD can be created and exposed to a DCS treatment step. Then a second set of lines are placed on top (within) the first set. In another scheme, Negative Tone Developer (NTD) compatible resist is for the first set of lines, and NTD for the second set of lines also, with a DCS Freeze of the first set of lines to fix those in place.

Note that the preceding description focused primarily on using a DCS freeze for patterning in a line-in-line scheme. Techniques herein are not limited to line-in-line patterning. DCS Freeze techniques can be applied in other patterning schemes. For example, DCS freeze can provide very beneficial results within a cross point contact schemes.

In a cross point contact scheme for example, two or more 2D (two dimensional) photoresist patterns are overlaid on each other so that trenches intersection. The locations where trenches intersect create a point or given shape that can be used to etch a contact pattern into an underlying layer. In a cross point patterning technique according to techniques herein, a substrate, layer(s) or hardmask to pattern is provided on a substrate such as a silicon wafer.

Figure 11:
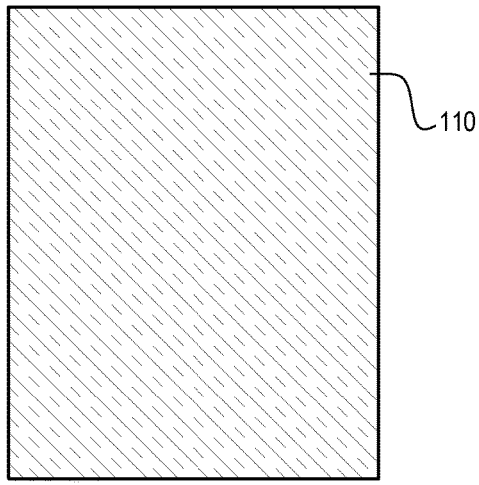
FIGS. 11-16 are schematic, top views of a substrate segment showing a process sequence for patterning a substrate.
Figure 12:
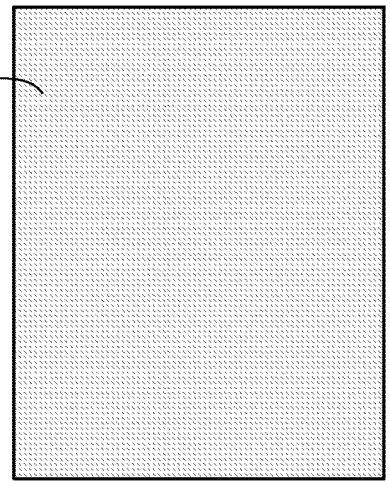
Figure 13:
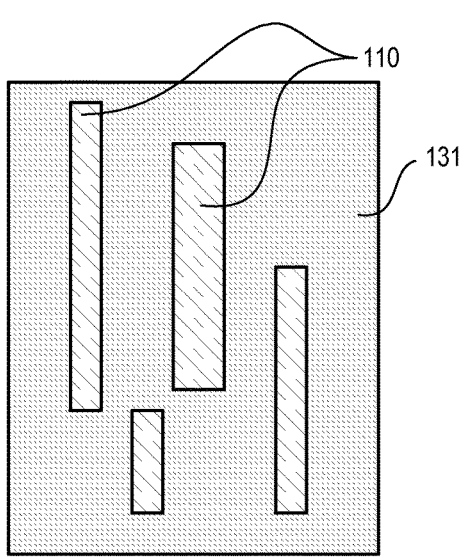

FIGS. 11-16 are schematic top views of a given substrate segment being processed according to techniques herein. In FIG. 11, underlying layer 110 is visible, which can be a target layer or hardmask to be patterned, etc. A first layer of radiation-sensitive material 115 is applied on the substrate, a result is shown in FIG. 12. Next the substrate is exposed to radiation through a photolithographic mask or reticle. The exposure creates a first exposure patter in the first layer of radiation-sensitive material. After developing the first exposure pattern using developing chemistry, a first patterned layer 131 is created as shown in FIG. 13. Note that the underlying layer 110 is now visible with trenches defined by the first patterned layer 131.

This first patterned layer 131, defining trenches, lines, or other shapes, is then treated with a DCS treatment in a plasma processing system. This can include exposure to a beam of ballistic electrons and a conformal or semi-conformal deposition of silicon such that an exposed surface or outer surface of the first patterned layer 131 is modified in solubility potential or otherwise protected. A thin layer of silicon oxide can be formed on the first patterned layer 131. Silicon deposition is a sputter deposition and thus can be conformal but typically results in a semi-conformal deposition with more deposition on horizontal surfaces as compared to vertical surfaces. This first patterned layer 131 is now frozen with respect to developing solvents.

Figure 14:
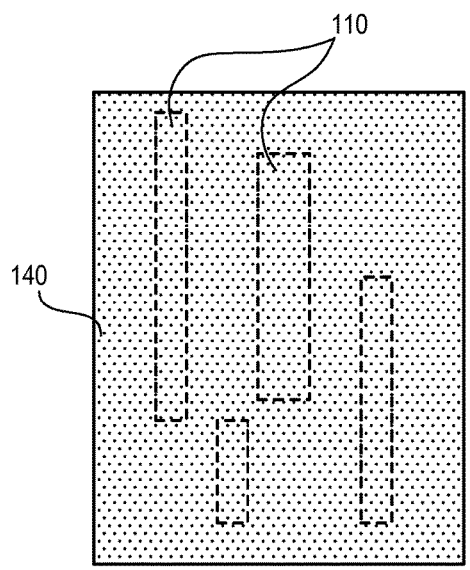

With a protective layer covering the first patterned layer 131 (and any cross-linking), a second radiation-sensitive composition is spun on the substrate. This second radiation-sensitive material is applied such that trenches are filled with the second radiation-sensitive material and the first patterned layer 131 is covered. An example result is shown in FIG. 14.

Figure 15:
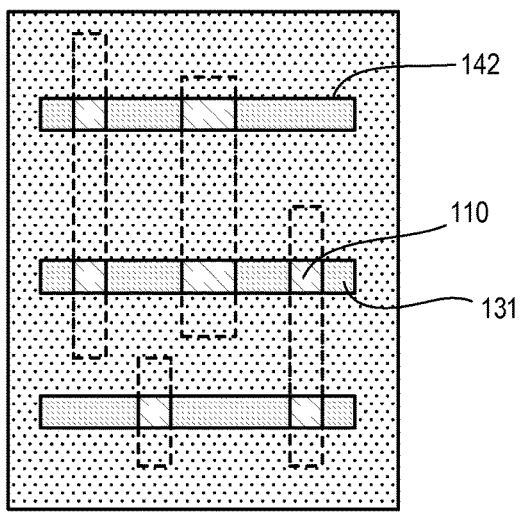
Figure 16:
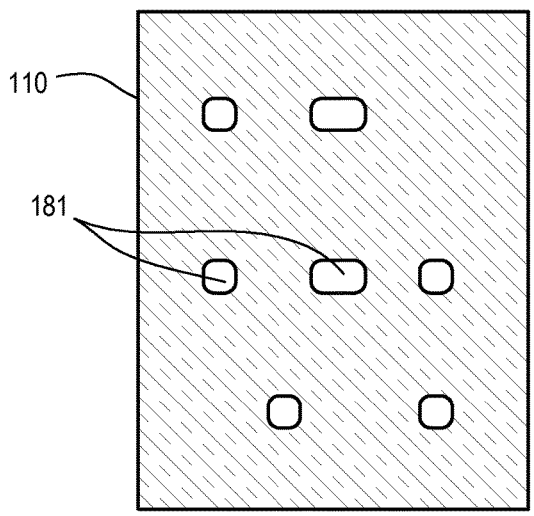

The substrate is then exposed to photolithographic radiation through a second or shifted mask or reticle, thereby creating a second exposure pattern in the second layer of radiation-sensitive material. This second exposure pattern is then developed resulting in a second patterned layer 142. In FIG. 15, the second patterned layer 142 defines three trenches. Note that where were created, a top surface of the first patterned layer 131 is visible. Also note that where trenches from the second patterned layer 142 intersect with trenches from the first patterned layer 131, a point or hole is created. In other words, where first and second trenches cross (intersect), a point is defined. This combined pattern can then be used to transfer defined holes into underlying layer 110, such as with an anisotropic etch process. FIG. 16 shows an example result.

Other schemes of elevationally crossing line patterns can result in a "dog bone" type of a shape. With such a shape, a pattern to be transferred can be rectangular with sides that are bowed inwardly. This particular shape can be beneficial in mitigating rounding effects during etch processes as an actual shape that is transferred can be substantially oval. Patterns within patterns or elevationally crossed patterns can be used in multiple different fabrications schemes and for various applications including logic and memory structures.

Figure 17:
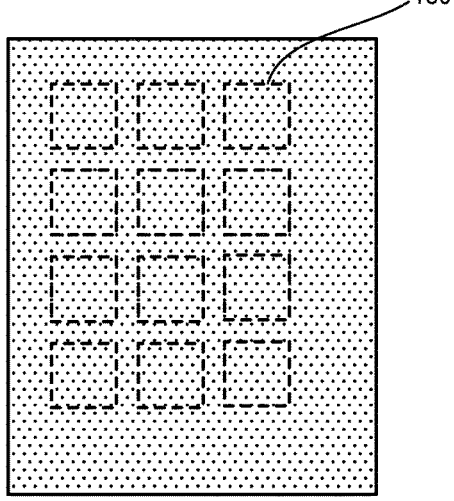
FIGS. 17-19 are schematic, top views of a substrate segment showing a process sequence for patterning a substrate.
Figure 18:
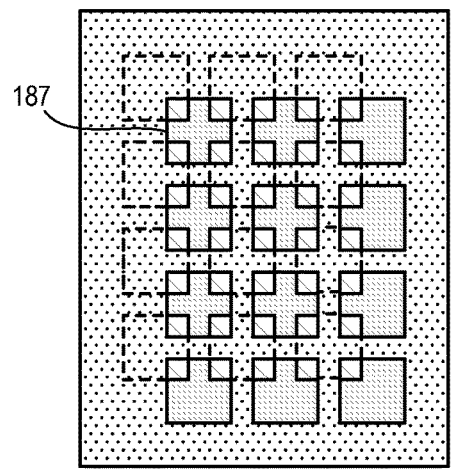
Figure 19:
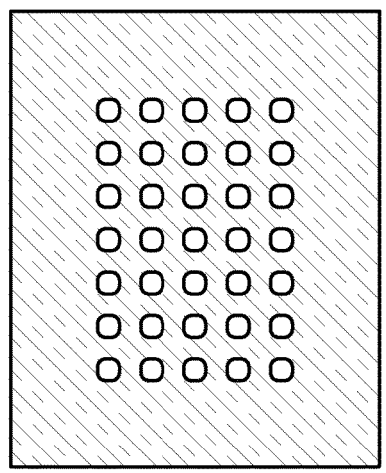

For example, FIGS. 17-19 show an abbreviated process flow for creating an array of memory contacts. An array of relatively large square openings 186 on a first patterned layer (lithographically exposed and developed) of resist is frozen using DCS herein, and then covered with a second resist. The second resist can also be an array of relatively large square opening, but with an exposure offset from the first resist layer exposure such that corners of rectangles 187 overlap with corners of rectangles 186. The second resist layer is then exposed and developed which uncovers an underlying layer at overlap locations. The overlapping portion can define an opening with an area roughly a tenth of the area of rectangles 186 and 187. FIG. 19 shows a resulting patterned underlying layer after transferring a combined patterning into the underlying layer such as with an anisotropic etch.

Processes herein have significant advantages over conventional patterning techniques. Compared to chemical and thermal freeze techniques, only the DCS freeze technique herein enables such double patterning using negative tone developer compatible resists—which is not possible with thermal and chemical solubility changing techniques. Moreover, with techniques disclosed herein it is possible to place logic contacts where ever desired on a substrate. Previously such contact placement was only possible using photolithographic masks. The DCS freeze can even provide advantages over mask-based contact hole placement. For example, photo lithographic masks can pattern down to critical dimension sizes of about 56 nm (nanometers). With the DCS freeze, however, holes can be patterned down to about 36 nm, which improvement (in the semiconductor device industry) is equivalent to an order of magnitude better than masking techniques alone, or a single reticle defining contact hole placement.

Note that techniques herein are not limited to LFLE processes, but can be used for other patterning processes, masking processes, and feature fabrication processes.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method for double patterning a substrate, the method comprising:

forming a first layer of radiation-sensitive material on a substrate;

developing a first exposure pattern in the first layer of radiation-sensitive material, the first exposure pattern having been exposed via photolithography, wherein developing the first exposure pattern results in a first patterned layer;

positioning the substrate in a processing chamber of a capacitively coupled plasma system;

treating the first patterned layer with a flux of electrons by coupling negative polarity direct current power to an upper electrode of the plasma processing system, the flux of electrons being accelerated from the upper electrode with sufficient energy to pass through a plasma and strike the substrate such that an exposed surface of the first patterned layer changes in physical properties, wherein the coupling of negative polarity direct current power to the upper electrode of the plasma processing system causes sputtering of material from the upper electrode onto the first patterned layer creating a semi-conformal layer of material on the first patterned layer;

forming a second layer of radiation-sensitive material on the substrate; and developing a second exposure pattern in the second layer of radiation-sensitive material, the second exposure pattern having been exposed via photolithography, wherein developing the second exposure pattern results in a second patterned layer such that the second patterned layer and the first patterned layer form a combined pattern.

2. The method of claim 1, wherein the material sputtered from the upper electrode, and deposited on the first patterned layer, creating the semi-conformal layer comprises silicon.

3. The method of claim 2, further comprising exposing the semi-conformal layer of silicon to an oxygen-containing environment such that the semi-conformal layer of silicon becomes silicon oxide.

4. The method of claim 1, wherein the plasma is created in the processing chamber from a process gas flowed into the processing chamber.

5. The method of claim 4, wherein the process gas comprises an inert gas and hydrogen or a noble gas and nitrogen.

6. The method of claim 1, wherein developing the first exposure pattern includes using developing chemicals to dissolve and remove the first exposure pattern from the first layer of radiation-sensitive material.

7. The method of claim 1, wherein changes in physical properties includes increased cross-linking of the exposed surface such that the exposed surface of the first patterned layer increases in resistance to developing chemicals.

8. The method of claim 1, wherein the first patterned layer includes a plurality of line structures.

9. The method of claim 1, wherein the first patterned layer includes structures created at a first spacing.

10. The method of claim 1, wherein the first patterned layer is selected from the group consisting of negative tone developer resist, positive tone developer resist, and alcohol-based resist; and
wherein the second patterned layer is selected from the group consisting of negative tone developer resist, positive tone developer resist, and alcohol-based resist.

11. The method of claim 1, wherein the first patterned layer is selected from a negative tone developer resist, and wherein the second patterned layer is selected from a negative tone developer resist.

12. The method of claim 1, wherein the combined pattern includes intersecting features.

13. The method of claim 1, wherein the combined pattern includes intersecting trenches.

14. The method of claim 1, wherein the combined pattern includes trenches defined by the second patterned layer that intersect with trenches defined by the first patterned layer.

15. The method of claim 14, wherein trench intersections define contact holes.

16. The method of claim 15, further comprising transferring defined contact holes to one or more underlying layers.

17. The method of claim 1, further comprising transferring the combined pattern to an underlying layer via an etch operation.

18. The method of claim 1, wherein the treating results in a specific thickness for the semi-conformal layer of material on the first patterned layer.

19. A method for double patterning a substrate, the method comprising:
forming a first layer of radiation-sensitive material on a substrate;
developing a first pattern in the first layer of radiation-sensitive material, the first pattern having been exposed via photolithography, wherein developing the first pattern results in a first patterned layer;
treating the first patterned layer with an electron flux formed by coupling negative polarity direct current power to an upper electrode in a plasma processing chamber, such that a protective layer is semi-conformally created on exposed surfaces of the first patterned layer by sputtering of material from the upper electrode by the coupling of negative polarity direct current power to the upper electrode in the plasma processing chamber, the electron flux sufficient to increase cross-linking of the first patterned layer;
forming a second layer of radiation-sensitive material on the substrate; and
developing a second pattern in the second layer of radiation-sensitive material, the second pattern having been exposed via photolithography, wherein developing the second pattern results in a second patterned layer having structures created between structures of the first patterned layer.

20. A method for double patterning a substrate, the method comprising:
forming a first layer of radiation-sensitive material on a substrate;
developing a first exposure pattern in the first layer of radiation-sensitive material, the first exposure pattern having been exposed via photolithography, wherein developing the first exposure pattern results in a first patterned layer;
positioning the substrate in a processing chamber of a capacitively coupled plasma system and flowing a process gas into the processing chamber;
creating plasma in the processing chamber above the substrate and applying negative polarity direct current power to an upper electrode of the plasma processing system, the upper electrode comprising silicon, such that a beam of ballistic electrons strike the substrate, the ballistic electrons originating from the upper electrode, and such that at least a portion of the silicon is sputtered from the upper electrode to form a semi-conformal layer of the silicon that is sputtered from the upper electrode on the first patterned layer;
removing the substrate from the processing chamber and exposing the substrate to an oxygen-containing atmosphere such that a semi-conformal layer of silicon oxide forms on the first patterned layer, the semi-conformal layer of silicon oxide being sufficiently thick such that the first patterned layer is protected from subsequent developing chemicals;
forming a second layer of radiation-sensitive material on the substrate; and
developing a second exposure pattern in the second layer of radiation-sensitive material, the second exposure pattern having been exposed via photolithography, wherein developing the second exposure pattern results in a second patterned layer such that the second patterned layer and the first patterned layer form a combined pattern.

21. The method of claim 20, wherein the first patterned layer is selected from the group consisting of negative tone developer resist, positive tone developer resist, and alcohol-based resist; and
wherein the second patterned layer is selected from the group consisting of negative tone developer resist, positive tone developer resist, and alcohol-based resist.

* * * * *